US012672542B2

(12) United States Patent
Park et al.

(10) Patent No.: US 12,672,542 B2
(45) Date of Patent: Jun. 30, 2026

(54) SEMICONDUCTOR DEVICE AND METHOD OF CONTROLLING DISTRIBUTION OF LIQUID METAL TIM USING LID STRUCTURE

(71) Applicant: STATS ChipPAC Pte. Ltd., Singapore (SG)

(72) Inventors: JongChan Park, Incheon (KR); YoungMin Kim, Incheon (KR); TaeKeun Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 432 days.

(21) Appl. No.: 18/311,473

(22) Filed: May 3, 2023

(65) Prior Publication Data

US 2024/0371719 A1 Nov. 7, 2024

(51) Int. Cl.
| | |
|---|---|
| *H10W 40/22* | (2026.01) |
| *H10W 40/70* | (2026.01) |
| *H10W 72/00* | (2026.01) |
| *H10W 72/30* | (2026.01) |
| *H10W 90/00* | (2026.01) |

(52) U.S. Cl.
CPC ........... *H10W 40/22* (2026.01); *H10W 40/70* (2026.01); *H10W 72/072* (2026.01); *H10W 72/07236* (2026.01); *H10W 72/073* (2026.01); *H10W 72/07336* (2026.01); *H10W 72/352* (2026.01); *H10W 72/877* (2026.01); *H10W 90/724* (2026.01); *H10W 90/736* (2026.01)

(58) Field of Classification Search
CPC ........... H01L 2224/26145; H01L 2224/26175
See application file for complete search history.

(56) References Cited

U.S. PATENT DOCUMENTS

| | | | | |
|---|---|---|---|---|
| 6,891,259 B2 * | 5/2005 | Im | .......................... | H10W 40/70 |
| | | | | 257/796 |
| 7,554,190 B2 * | 6/2009 | Macris | .................. | H10W 76/48 |
| | | | | 257/E23.101 |
| 7,679,184 B2 * | 3/2010 | Kusano | .................. | H10W 40/73 |
| | | | | 257/714 |
| 7,928,562 B2 * | 4/2011 | Arvelo | .................. | H10W 40/22 |
| | | | | 257/725 |
| 8,258,013 B1 * | 9/2012 | Nagarajan | ............. | H10W 42/00 |
| | | | | 438/106 |

(Continued)

*Primary Examiner* — Dale E Page
*Assistant Examiner* — Rohit Parthasarathy
(74) *Attorney, Agent, or Firm* — Brian M. Kaufman; Robert D. Atkins; PATENT LAW GROUP: Atkins and Associates, P.C.

(57) ABSTRACT

A semiconductor device has an electrical component and a heat sink disposed over the electrical component. The heat sink has a cover with a wall extending from the cover forming a pocket around a perimeter of the electrical component. The heat sink also has a horizontal step, and a riser extending from the horizontal step to the cover. The wall extends from the cover to form the pocket. A TIM is disposed between the cover and a surface of the electrical component. The TIM can be liquid metal. The heat sink is pressed onto the TIM under force and heat to distribute the TIM between the cover and surface of the electrical component. The TIM remains contained within the pocket by the wall. The wall or cover can have a vent hole. The TIM may extend over a side surface of the electrical component.

24 Claims, 14 Drawing Sheets

(56)                     References Cited

U.S. PATENT DOCUMENTS

|  |  |  |  |  |
|---|---|---|---|---|
| 9,281,228 | B2 * | 3/2016 | Choi | H10P 72/74 |
| 10,163,754 | B2 * | 12/2018 | Ho | H10W 40/77 |
| 10,242,956 | B1 * | 3/2019 | Lee | H10W 42/00 |
| 10,529,645 | B2 * | 1/2020 | Gandhi | H10W 40/22 |
| 11,229,120 | B1 * | 1/2022 | Ferullo | H05K 1/181 |
| 11,387,161 | B2 * | 7/2022 | Eid | H10W 40/22 |
| 11,488,886 | B2 * | 11/2022 | Hirobe | H10W 40/22 |
| 11,507,017 | B2 * | 11/2022 | Shen | G03G 21/1666 |
| 11,616,000 | B2 * | 3/2023 | Han | H10W 40/258 |
|  |  |  |  | 257/659 |
| 11,842,944 | B2 * | 12/2023 | Arrington | H10W 40/25 |
| 11,894,282 | B2 * | 2/2024 | Wan | H10W 40/22 |
| 12,183,651 | B2 * | 12/2024 | Hirobe | H10W 40/22 |
| 2003/0085475 | A1 * | 5/2003 | Im | H10W 40/70 |
|  |  |  |  | 257/796 |
| 2004/0075987 | A1 * | 4/2004 | Shim | H10W 40/10 |
|  |  |  |  | 257/E23.101 |
| 2007/0045819 | A1 * | 3/2007 | Edwards | H10W 76/12 |
|  |  |  |  | 257/E23.087 |
| 2010/0116534 | A1 * | 5/2010 | Choi | H05K 3/305 |
|  |  |  |  | 29/839 |
| 2013/0119529 | A1 * | 5/2013 | Lin | H10W 40/22 |
|  |  |  |  | 438/118 |
| 2013/0137217 | A1 * | 5/2013 | Kindo | H10W 74/014 |
|  |  |  |  | 438/109 |
| 2014/0197533 | A1 * | 7/2014 | Imamura | H10W 40/22 |
|  |  |  |  | 438/122 |
| 2017/0178988 | A1 * | 6/2017 | Cheney | H10W 70/65 |
| 2019/0045666 | A1 * | 2/2019 | Liang | H05K 7/20463 |
| 2020/0373220 | A1 * | 11/2020 | Chan Arguedas | H10W 40/70 |
| 2021/0202348 | A1 * | 7/2021 | Arrington | H10W 40/25 |
| 2021/0327782 | A1 * | 10/2021 | Han | H10W 40/258 |
| 2022/0344297 | A1 * | 10/2022 | Chee | H10W 40/22 |
| 2023/0022643 | A1 * | 1/2023 | Chang | H10W 40/22 |
| 2023/0119942 | A1 * | 4/2023 | Park | H10W 40/22 |
|  |  |  |  | 257/659 |
| 2023/0378017 | A1 * | 11/2023 | Hsieh | H10W 40/22 |
| 2024/0332113 | A1 * | 10/2024 | Hsieh | H10W 40/22 |
| 2024/0371719 | A1 * | 11/2024 | Park | H10W 40/22 |

* cited by examiner

140

144    146    144

142    148    149    148    142

140

142    142

144    146    144

SEMICONDUCTOR DEVICE AND METHOD OF CONTROLLING DISTRIBUTION OF LIQUID METAL TIM USING LID STRUCTURE

FIELD OF THE INVENTION

The present invention relates in general to semiconductor devices and, more particularly, to a semiconductor device and method of controlling distribution of liquid metal thermal interface material (TIM) using a cover or lid structure with walls forming a pocket around the semiconductor device.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One or more semiconductor die can be integrated into a semiconductor package for higher density in a small space and extended electrical functionality. The trend is toward higher performance, higher integration, and miniaturization. The high level of integration, as well as high switching speed or high current conduction, contributes to heat generation during operation. A heat sink or heat spreader is commonly used to dissipate excess heat. A TIM is disposed between the heat sink and a surface of the semiconductor die to assist with the transfer of heat between the semiconductor die and heat sink.

Some heat dissipation applications require a liquid metal TIM to increase the thermal conductivity and heat transfer properties between the semiconductor die and heat sink. However, liquid metal TIM tends to bleed out from the area between the heat sink and the surface of the semiconductor die, i.e., where it is most needed and effective, during the attachment of the heat sink. A need exists to maintain the TIM between the heat sink and the surface of the semiconductor die during the attachment of the heat sink.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
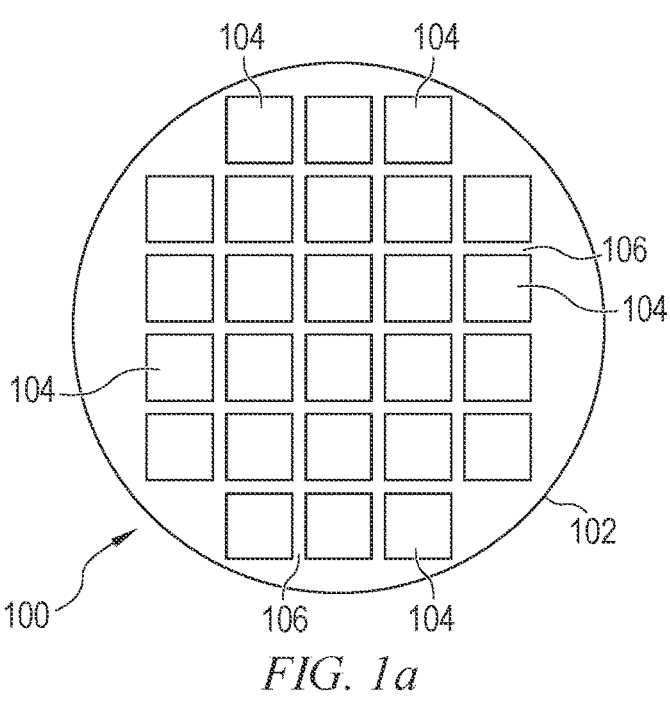
FIGS. 1a-1c illustrate a first semiconductor wafer with a plurality of first semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
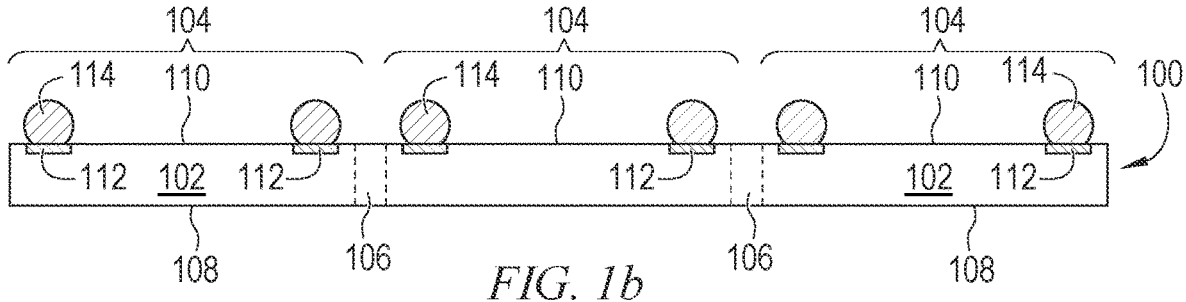

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
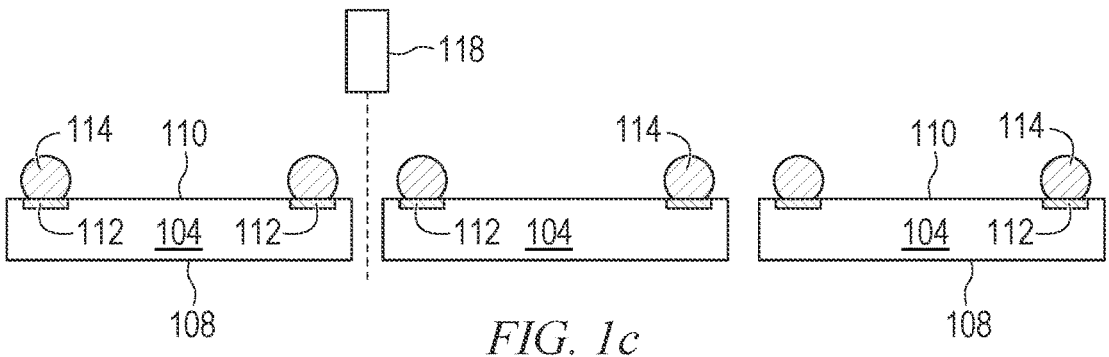

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
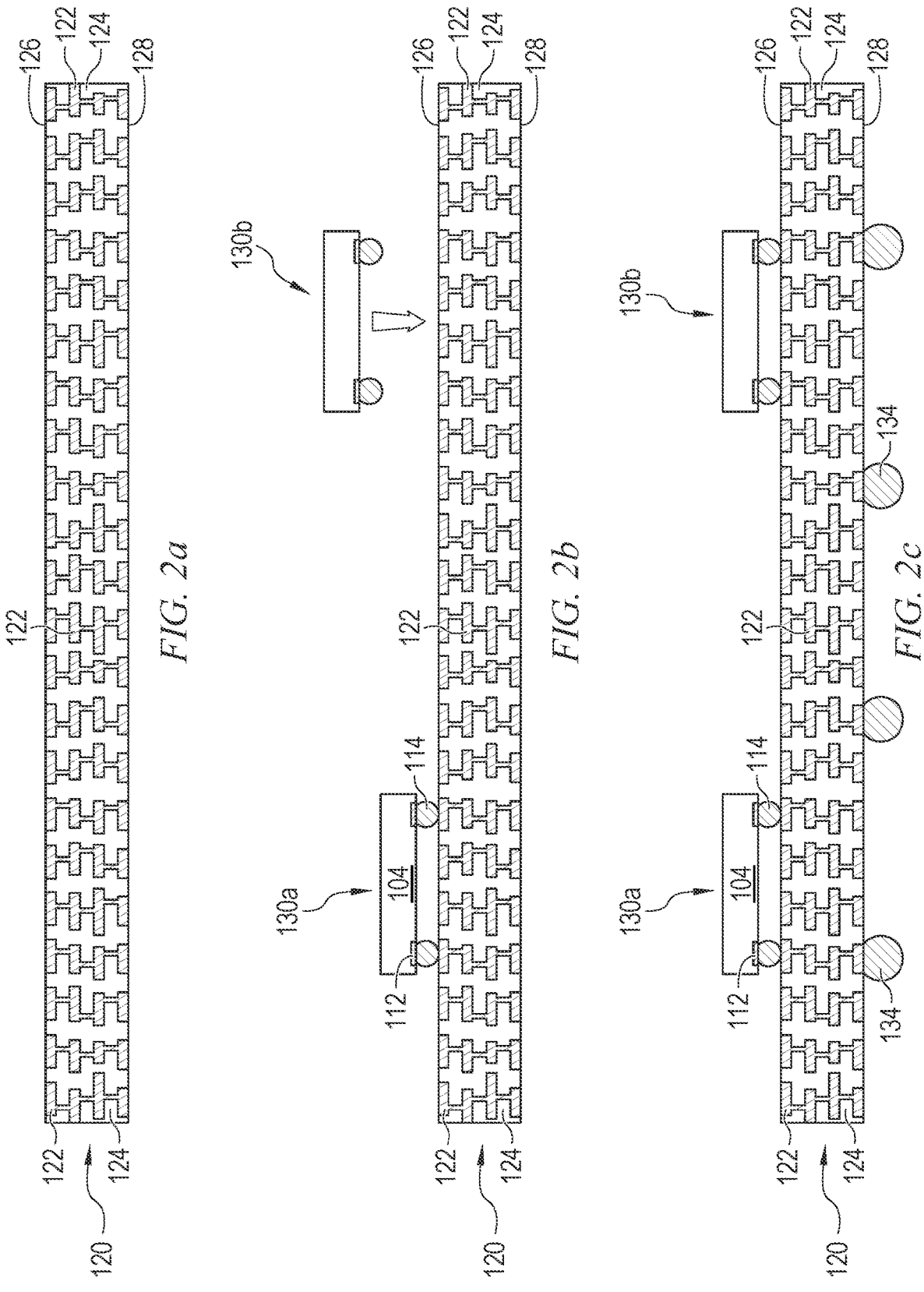
FIGS. 2a-2c illustrate a process of disposing electrical components over a substrate.

FIGS. 2*a*-2*c* illustrate a process of disposing electrical components over a substrate. FIG. 2*a* shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

In FIG. 2*b*, electrical components 130a-130b are disposed on surface 126 of interconnect substrate 120 and electrically and mechanically connected to conductive layers 122. For example, electrical components 130a and 130b can be similar to, or made similar to, semiconductor die 104 from FIG. 1*c* with bumps 114 oriented toward surface 126 of substrate 120. Electrical components 130a-130b can be discrete electrical devices, or IPDs, such as a diode, transistor, resistor, capacitor, and inductor. Alternatively, electrical components 130a-130b can include other semiconductor die, semiconductor packages, surface mount devices, RF components, discrete electrical devices, or integrated passive devices (IPD).

Electrical components 130a-130b are positioned over substrate 120 using a pick and place operation. Electrical components 130a-130b are brought into contact with conductive layer 122 on surface 126 of substrate 120 and electrically and mechanically connected to conductive layer 122 by reflowing bumps 114, conductive paste, or any other bonding technique. FIG. 2*c* illustrates electrical components 130a-130b electrically and mechanically connected to conductive layers 122 of substrate 120.

An electrically conductive bump material is deposited over conductive layer 122 on surface 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 134. In one embodiment, bump 134 is formed over a UBM having a wetting layer, barrier layer, and adhesive layer. Bump 134 can also be compression bonded or thermocompression bonded to conductive layer 122. Bump 134 represents one type of interconnect structure that can be formed over conductive layer 122. The interconnect structure can also use bond wires, conductive paste, stud bump, micro bump, or other electrical interconnect.

Figures 3A, 3B:
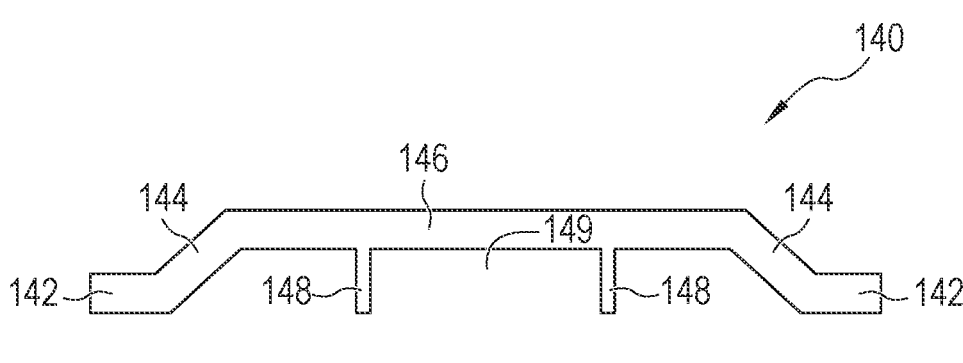
FIGS. 3a-3e illustrate a heat sink with a vertical wall forming a pocket.

Electrical components 130a-130b may dissipate substantial thermal energy due to a high level of integration, as well as high switching speed or high current conduction during operation. FIGS. 3*a*-3*e* illustrates various views of heat sink or heat spreader 140. FIG. 3*a* illustrates a cross-sectional side view of heat sink 140 with horizontal step 142, angled or vertical riser 144, horizontal cover or lid 146, vertical walls 148, and pocket 149 as the area within the vertical walls. The height of vertical walls 148 is determined by the height of electrical component 130a-130b. Heat sink 140 will be used to dissipate excessive heat away from electrical components 130a-130b. Heat sink 140 can be one or more layers of Al, Cu, Sn, Ni, Au, Ag, or other suitable thermally conductive material. In one embodiment, vertical walls 148 are molded as unibody extensions of cover or lid 146.

Figure 3C:
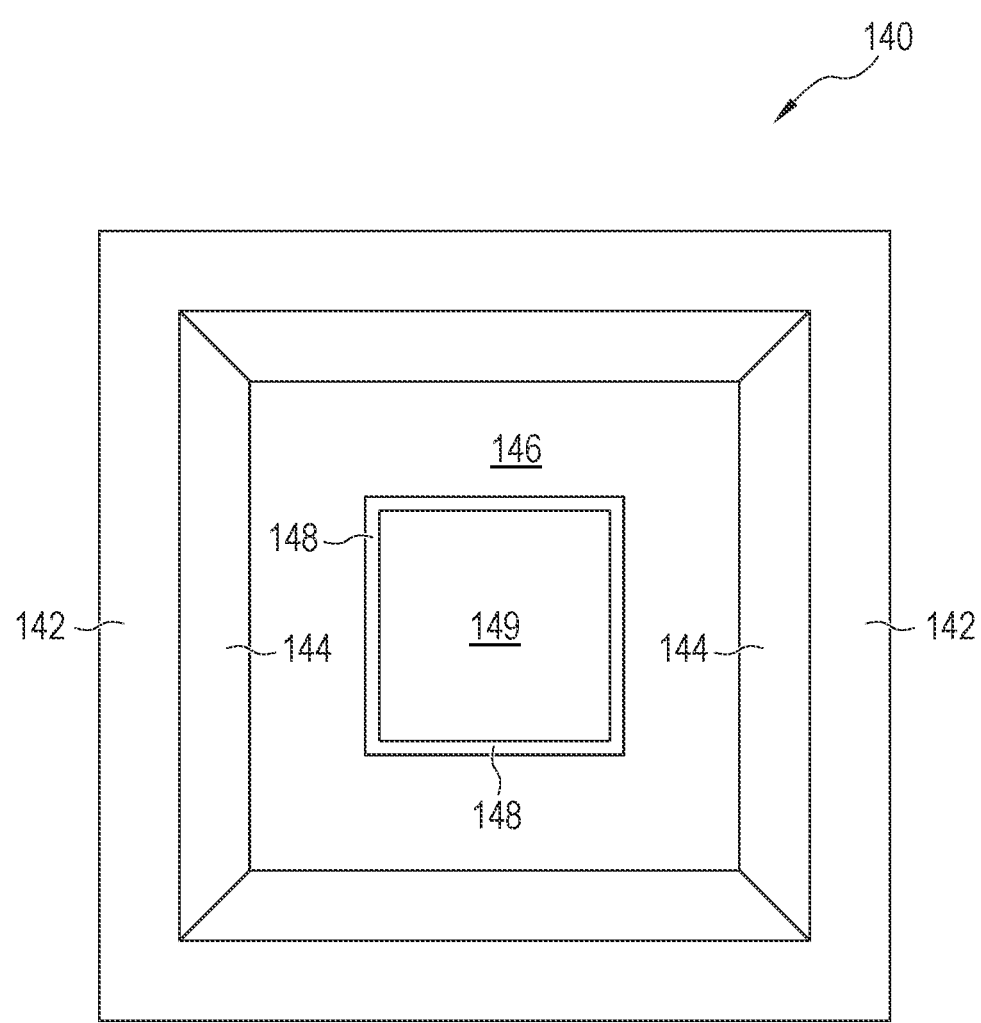
Figure 3D:
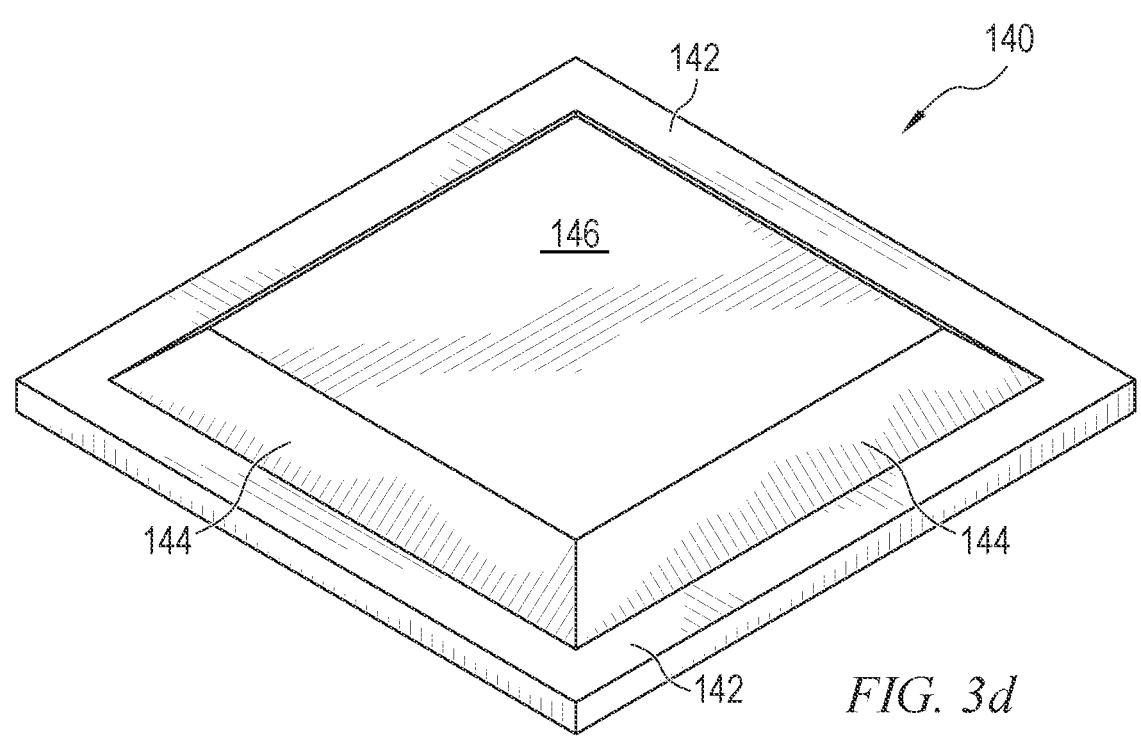
Figure 3E:
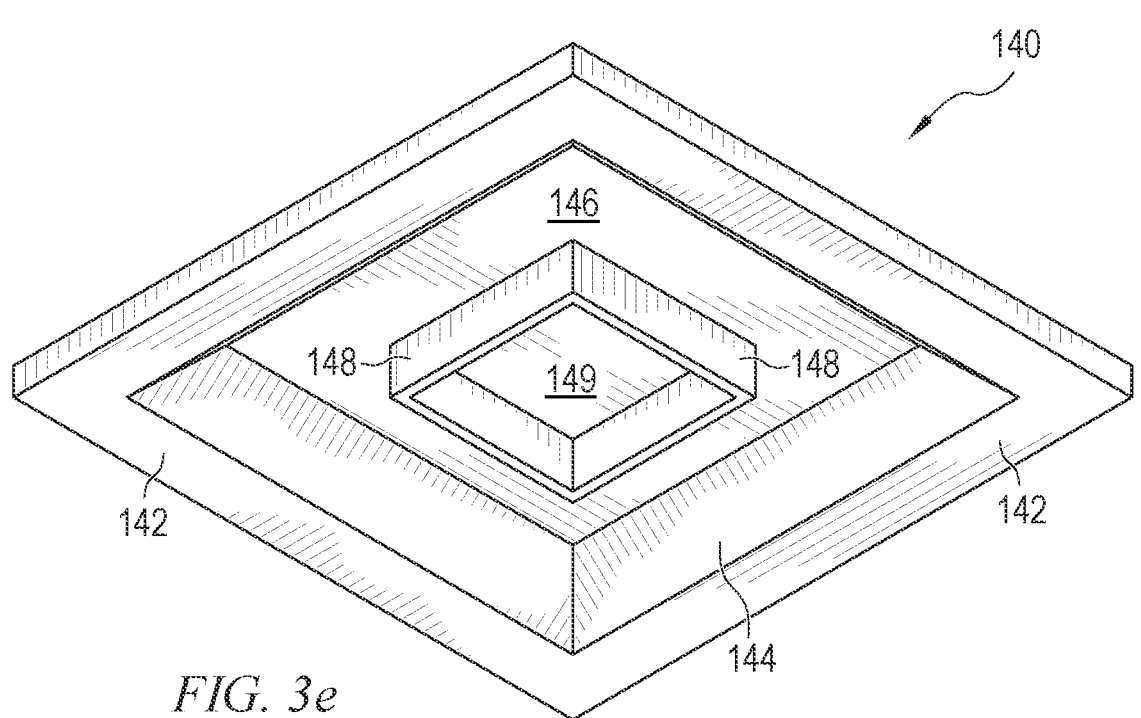

FIG. 3*b* is a top view of heat sink 140 showing horizontal step 142, angled or vertical riser 144, and cover or lid 146. FIG. 3*c* is a bottom view of heat sink 140 showing horizontal step 142, angled or vertical riser 144, cover or lid 146, walls 148, and pocket 149. FIG. 3*d* is a perspective top view of heat sink 140 showing horizontal step 142, angled or vertical riser 144, and cover or lid 146. FIG. 3e is a perspective bottom view of heat sink 140 showing horizontal step 142, angled or vertical riser 144, cover or lid 146, walls 148, and pocket 149. Vertical walls 148 extend around a perimeter of pocket 149. Pocket 149 is intended to contain electrical component 130a-130b.

Figures 4A, 4B:
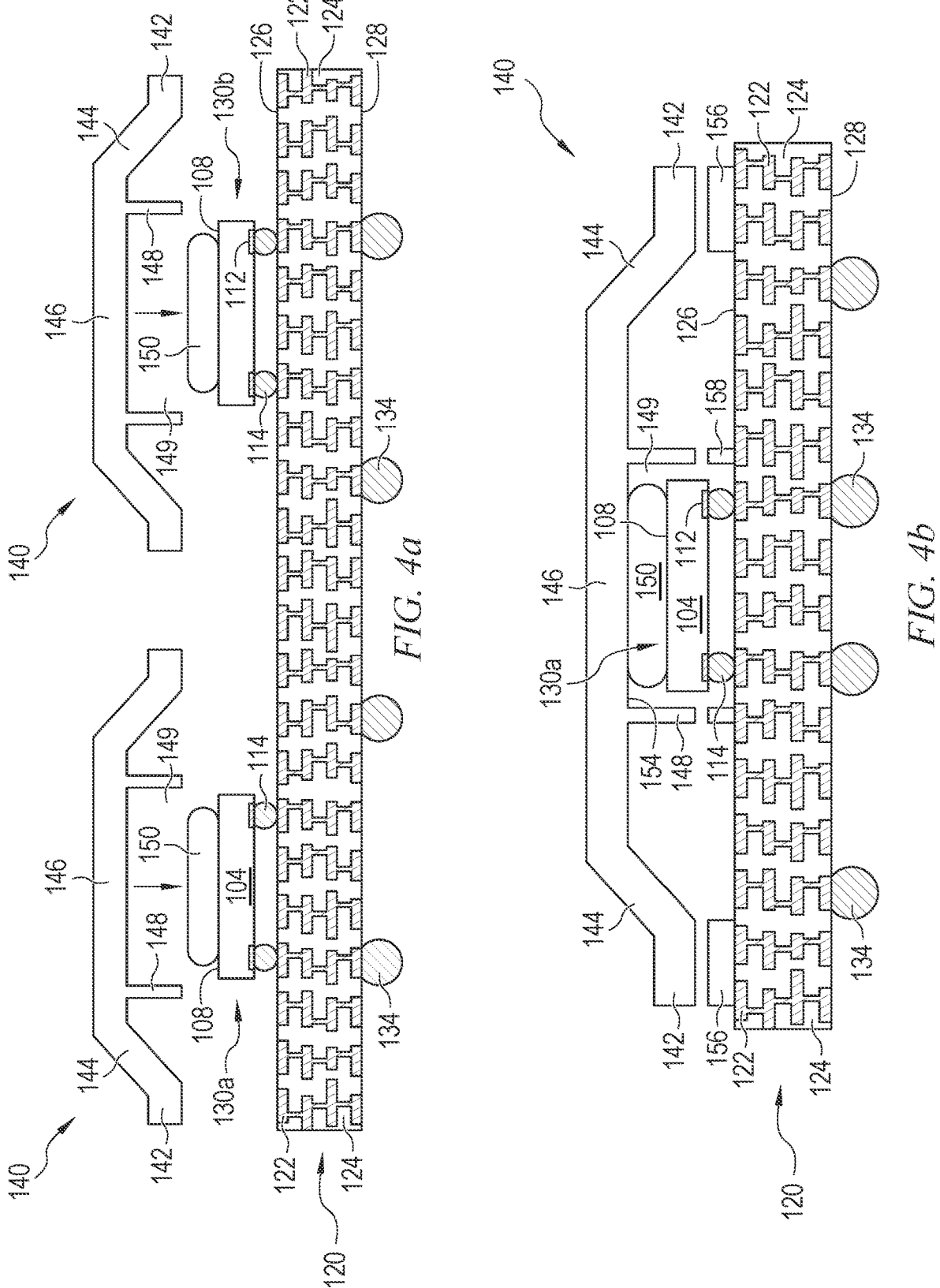
FIGS. 4a-4e illustrate a process of disposing the heat sink over the electrical component while maintaining the TIM within the pocket.

Continuing from FIG. 2c, TIM 150 is deposited over back surface 108 of electrical components 130a-130b, as shown in FIG. 4a. In one embodiment, TIM 150 is a liquid metal TIM, such as Ga—In—Sn, Ga—In, or other liquid metal based TIM. Liquid metal TIM has a high thermal conductivity greater than 40 W/(m*K) and better heat transfer properties. Alternatively, TIM 150 can be an adhesive with filler containing alumina, Al, aluminum zinc oxide, or other material having good heat transfer properties. Heat sink 140, as taken from FIGS. 3a-3e, is positioned over electrical components 130a-130b and substrate 120 using a pick and place operation. Cover or lid 146 is positioned over TIM 150, as deposited on back surface 108.

FIG. 4b shows further detail of mounting heat sink 140 relative to electrical component 130a, for the purpose of simplification. The same process occurs for mounting heat sink 140 to electrical component 130b. Heat sink 140 is brought into position so that bottom surface 154 of cover or lid 146 contacts or rests upon TIM 150. At this point, horizontal step 142 may or may not have contacted surface 126 of substrate 120, or any adhesive or bonding agent deposited thereon. Likewise, vertical walls 148 may or may not have contacted surface 126, or any adhesive or bonding agent deposited thereon.

Figures 4C, 4D:
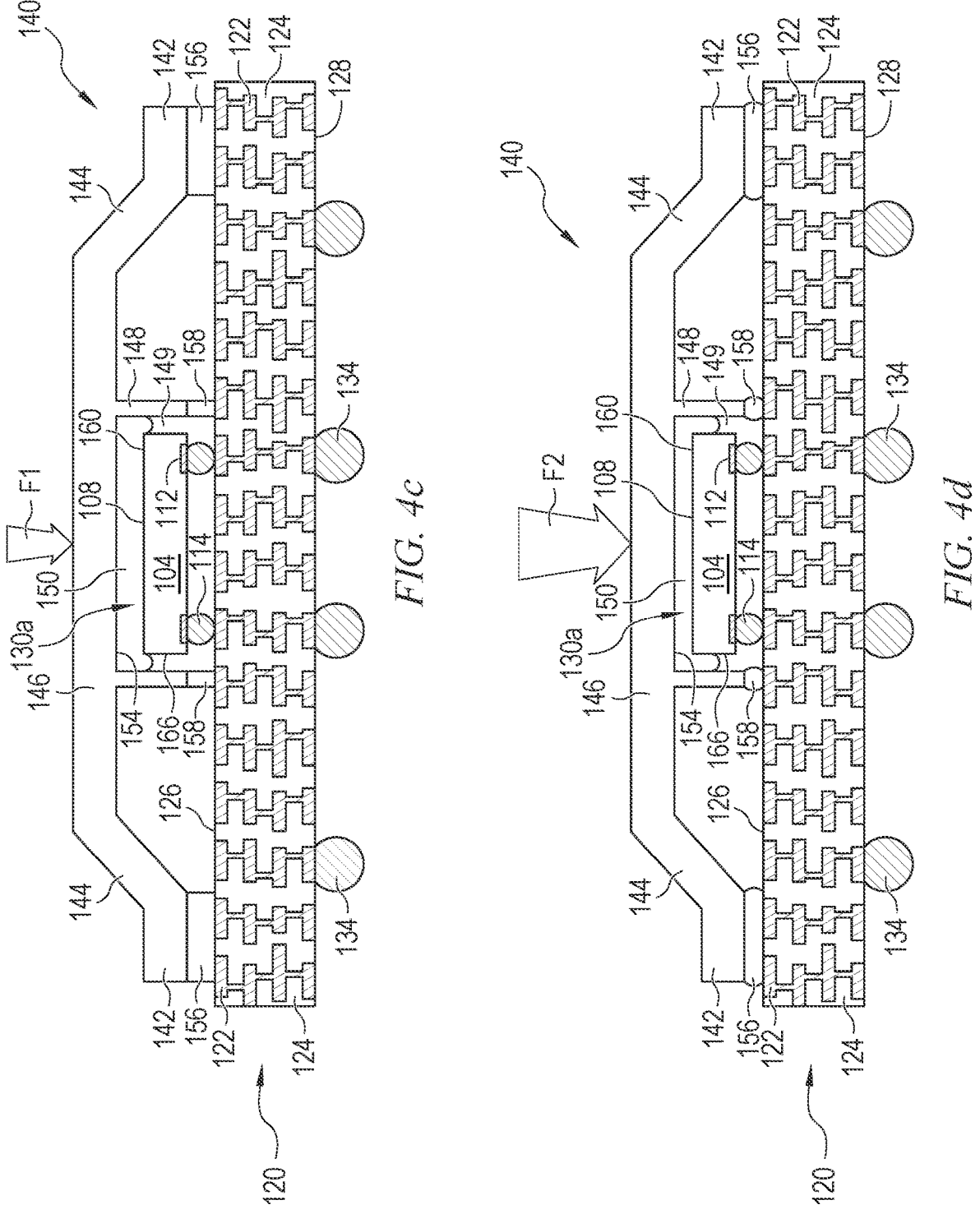

In FIG. 4c, force F1 is applied to heat sink 140, centered on cover or lid 146, to press the heat sink onto TIM 150 and electrical component 130a. In one embodiment, force F1 can be 10-30 newtons (N) per unit. At this point, horizontal step 142 and vertical walls 148 likely contact surface 126 of substrate 120, or any adhesive or bonding agent deposited thereon. Horizontal step 142 is bonded to surface 126 with adhesive or bonding agent 156. Vertical walls 148 are sealed to surface 126 with adhesive or bonding agent 158. Electrical component 130a is at least partially if not completely disposed within pocket 149 of heat sink 140. In particular, force F1 pressing on heat sink 140 causes cover or lid 148 to evenly and uniformly distribute TIM 150 across surface 108. As TIM 150 laterally approaches top edge 160 of electrical component 130a, the TIM is controlled by vertical wall 148 to remain in pocket 149. Excess TIM 150 is routed down along walls 148 while remaining in pocket 149 over side surface 166 of electrical component 130a.

After force F1, force F2 is applied to heat sink 140, centered on cover or lid 146, to further press the heat sink onto TIM 150 and electrical component 130a, as in FIG. 4d. A heat source is applied in combination with force F2. In one embodiment, force F2 can be 200 N per unit and the heat can be 125° C. Horizontal step 142 and vertical walls 148 firmly contact surface 126 of substrate 120, or any adhesive or bonding agent deposited thereon. Horizontal step 142 is bonded to surface 126 with adhesive or bonding agent 156. Vertical walls 148 are sealed to surface 126 with adhesive or bonding agent 158. The force F2 pressing on heat sink 140 in the presence of heat causes cover or lid 148 to evenly and uniformly distribute TIM 150 across surface 108. During the application of heat, such as mass reflow, TIM 150 would thermally expand and shrink in accordance with its coefficient of thermal expansion (CTE), particularly if it is in the form of liquid metal. With heat sink 140, TIM 150 is controlled by vertical walls 148 to remain in pocket 149.

Excess TIM 150 is routed down along walls 148 while remaining within pocket 149 over side surface 166 of electrical component 130a.

Figure 4E:
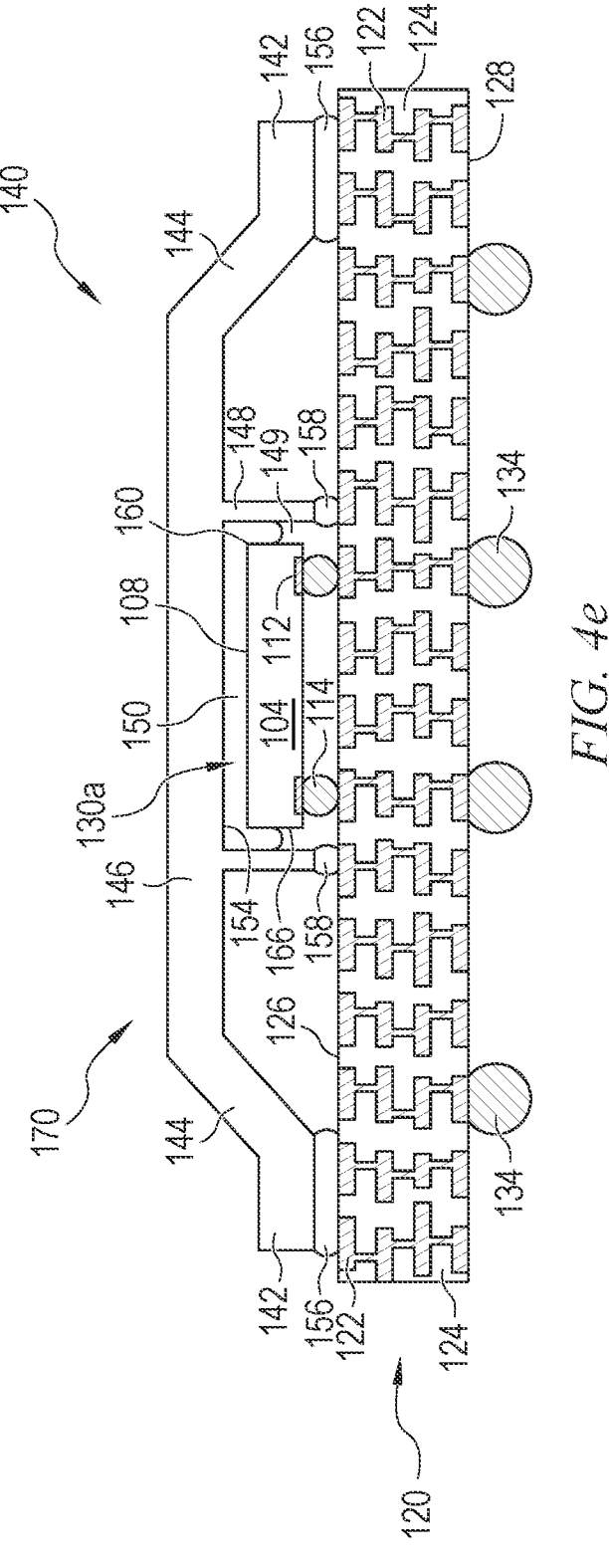

In FIG. 4e, force F2 and the heat are removed allowing TIM 150 to cure. FIG. 4e shows heat sink 140 mounted to substrate 120 with TIM 150 evenly and uniformly distributed over surface 108 and partially along side surface 166 of electrical component 130a. Electrical component 130a is disposed within pocket 149 of heat sink 140. There is little or no bleed out of TIM 150 as heat sink 140 with walls 148 forming pocket 149 control the TIM to remain in the pocket. That is, vertical walls 148 extending around a perimeter of electrical component 130a block any bleed out of TIM 150. More TIM 150 remains where it is most effective to enable the heat transfer between electrical component 130a and heat sink 140, i.e., more TIM remains on back surface 108, edge 160, and side surfaces 166. The even and uniform distribution of TIM 150 on back surface 108, edge 160, and side surfaces 166 reduces the risk of delamination between cover or lid 146 and electrical component 130a. Electrical component 130b would follow a similar process and yield a similar result. In one embodiment, electrical component 130a or 130b forms a flipchip ball grid array with heat sink (fcBGA-H) 170.

Figure 5A:
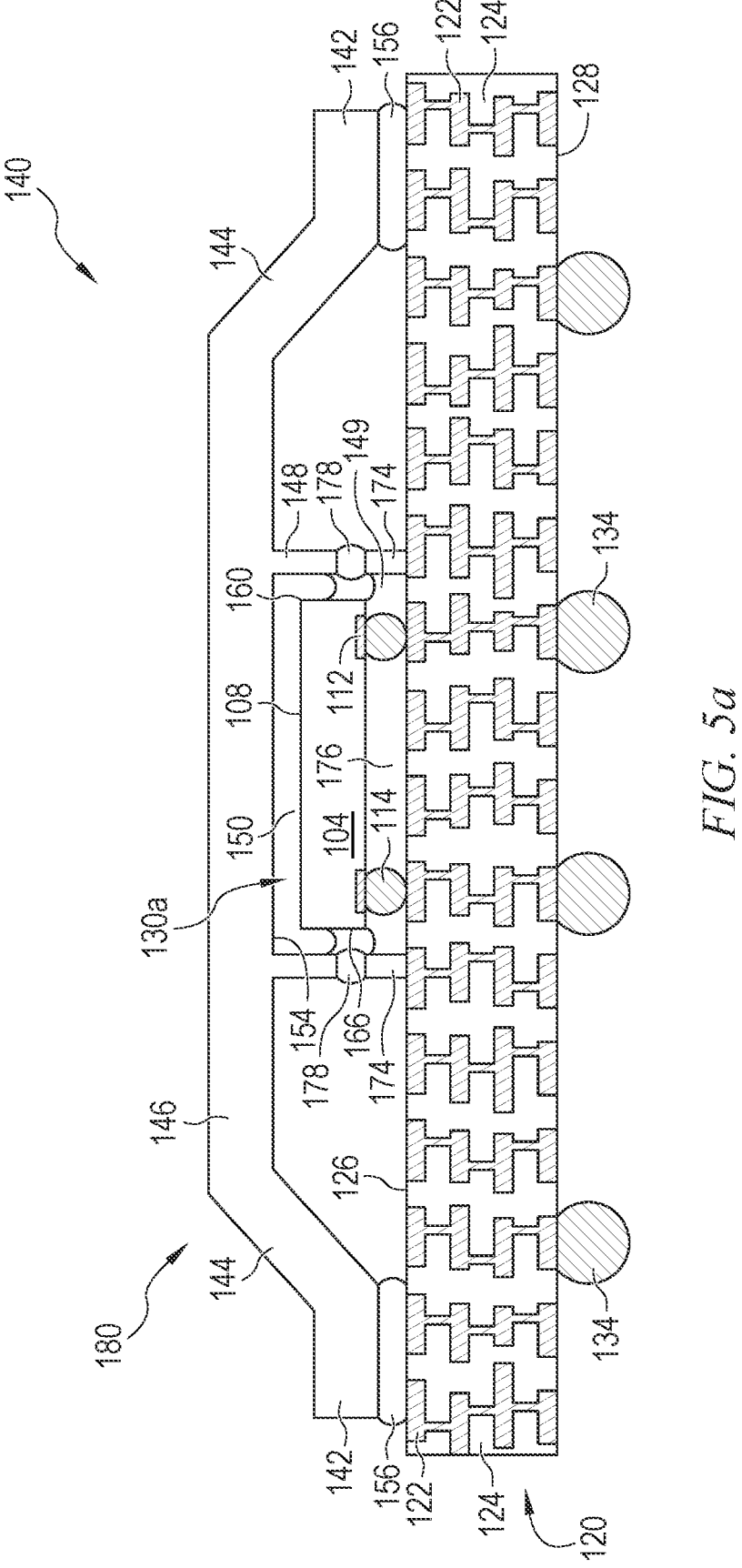
FIGS. 5a-5b illustrate a process of disposing the heat sink over the electrical component with the vertical walls contacting a dam material.
Figure 5B:
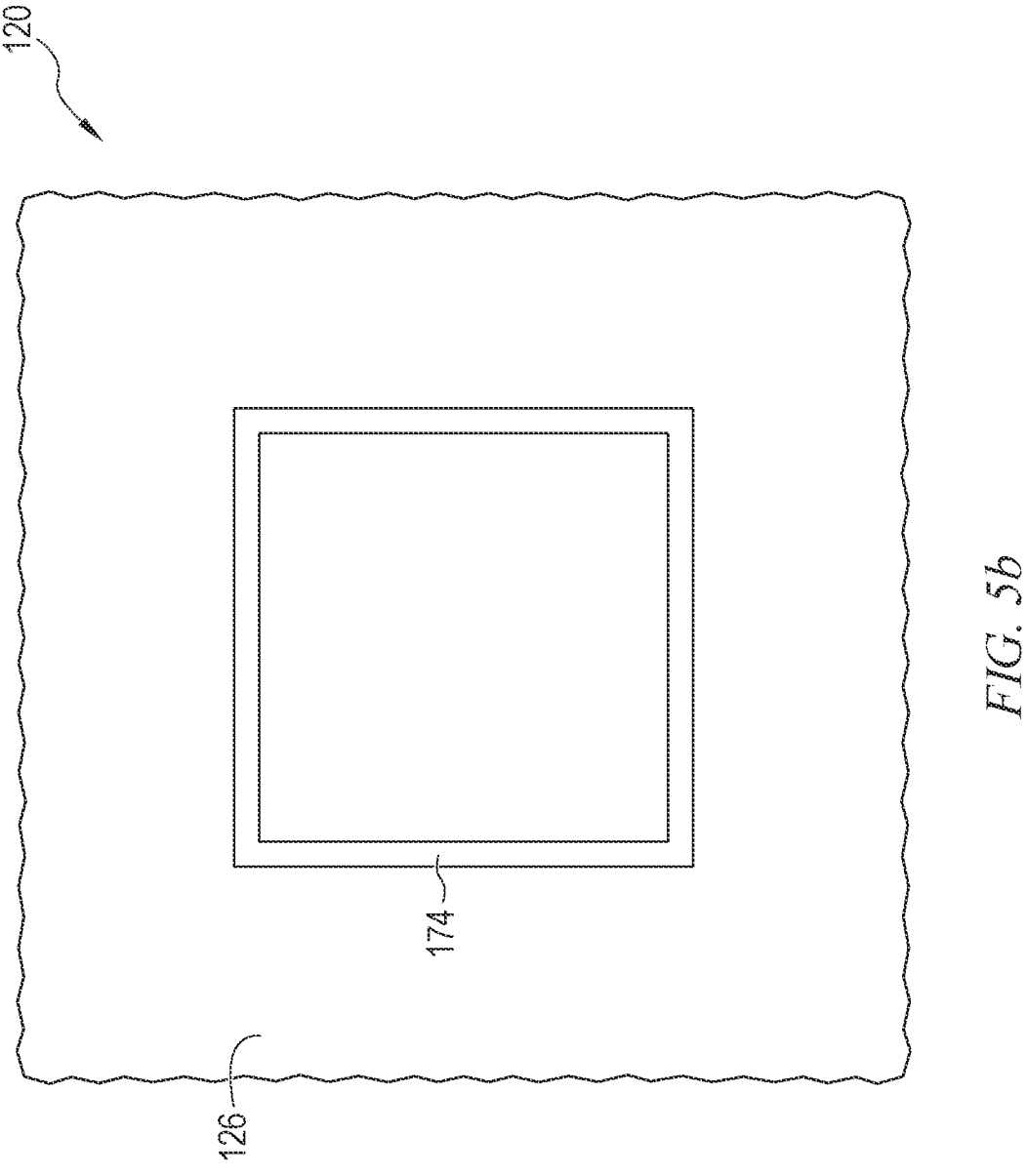

FIG. 5a shows another embodiment of fcBGA-H 180 with dam material 174 deposited on surface 126 of substrate 120. Dam material 174 extends around a perimeter of electrical component 130a, as shown in FIG. 5b. Dam material 174 can be solder resist, metal, or other similar material. Dam material 174 acts as a dam to retain underfill material 176, such as epoxy resin, deposited under electrical component 130a. In this case, vertical wall 148 is bonded to dam material 174 with adhesive 178.

Figure 6:
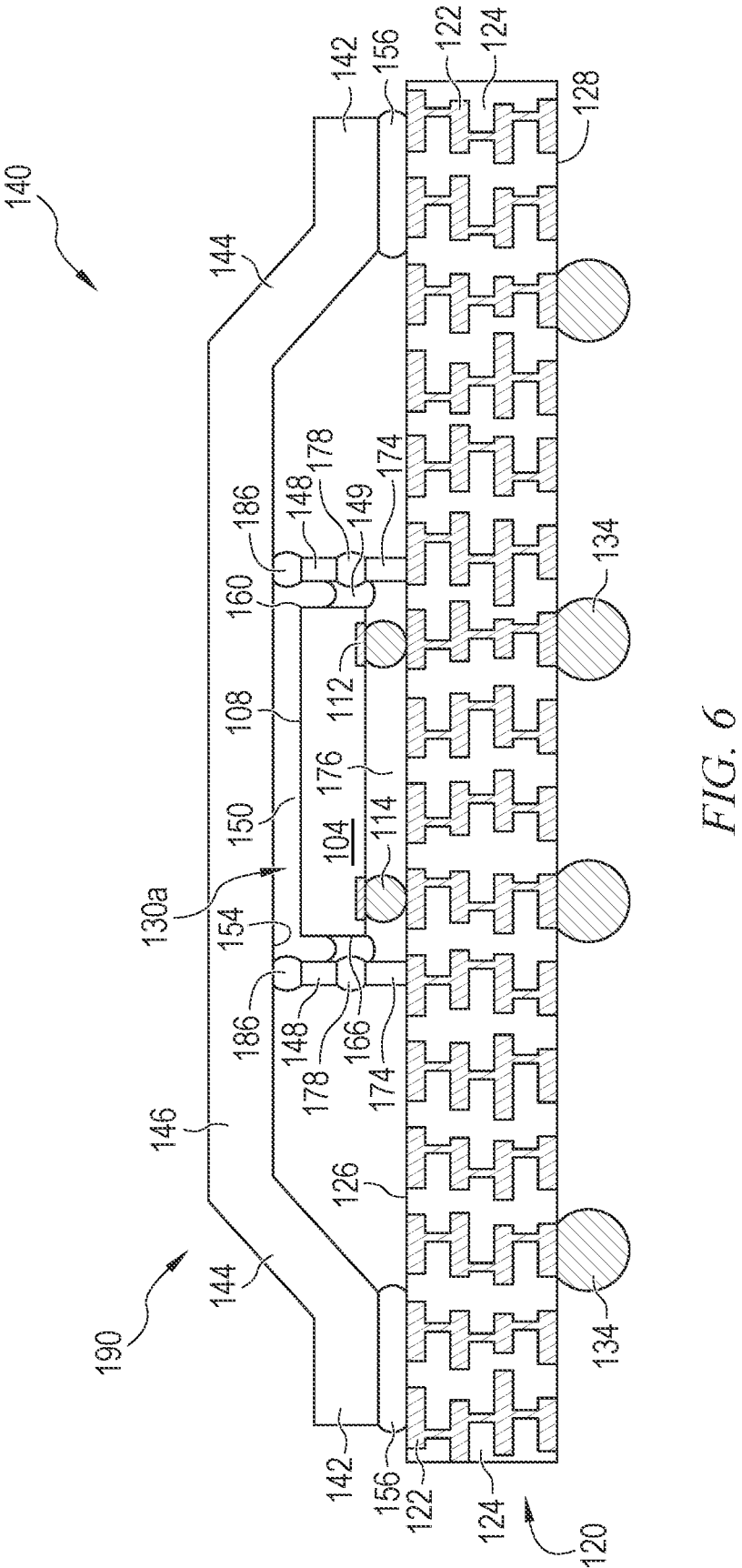
FIG. 6 illustrates the heat sink over the electrical component with the vertical walls separate from the heat sink.

FIG. 6 illustrates another embodiment of fcBGA-H 190, similar to FIG. 5a-5b, with dam material 174 and underfill material 176. In this case, vertical wall 148 is a separate body, bonded to surface 154 of heat sink 140 with adhesive 186.

Figures 7A, 7B:
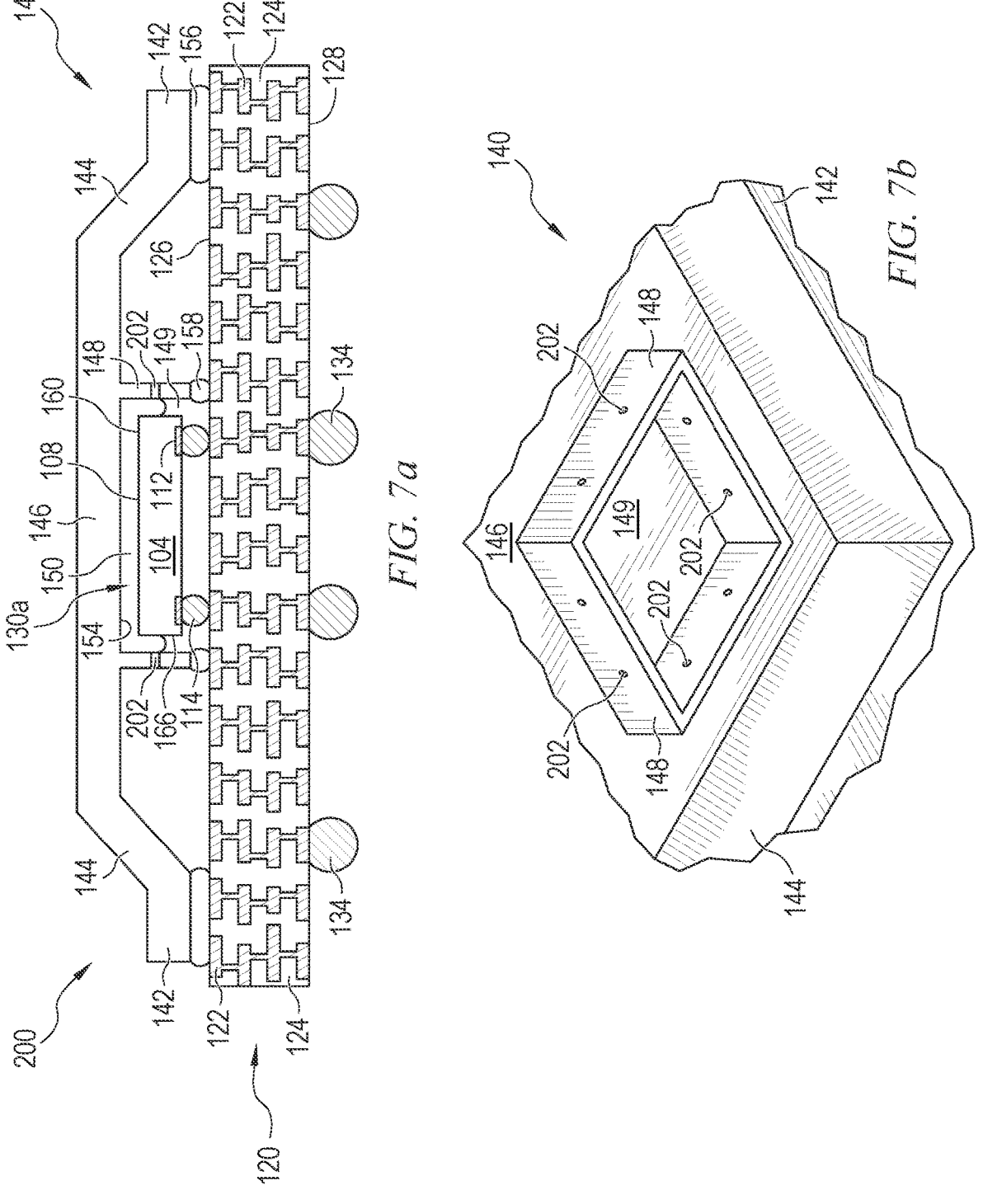
FIGS. 7a-7b illustrate vent holes in the wall of the heat sink.

In another embodiment, continuing from FIG. 4e, vent holes 202 are formed in walls 148, as shown in FIGS. 7a and 7b. Vent holes 202 allow a controlled bleed out of air and possibly a deminimus portion of TIM 150. The vast majority of TIM 150 remains in the controlled pocket 149 of heat sink 140 in fcBGA-H 200. Vents holes 202 can be applied in fcBGA-H 180 and in fcBGA-H 190.

Figures 8A, 8B:
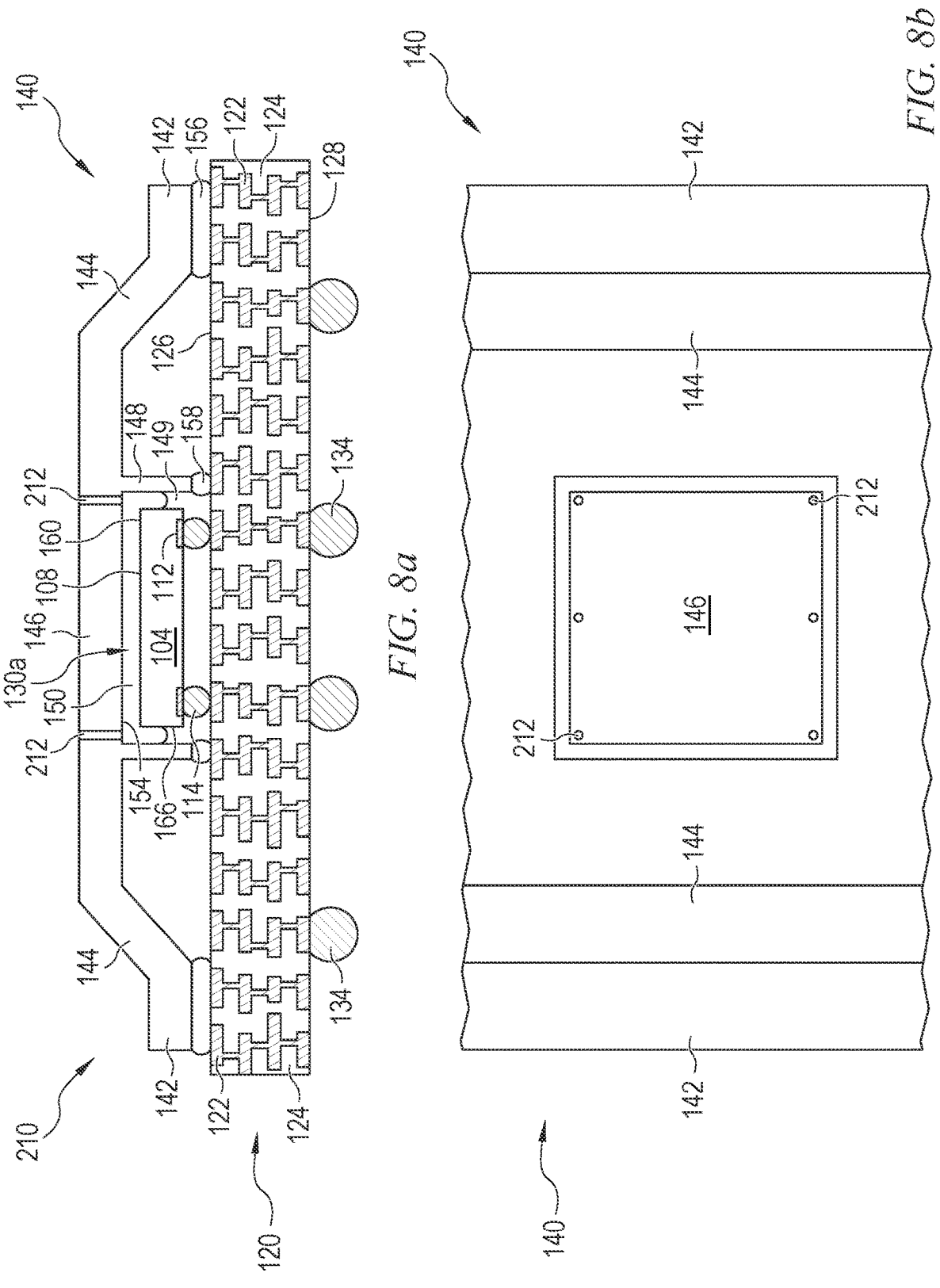
FIGS. 8a-8b illustrate vent holes in the cover of the heat sink.

In another embodiment, continuing from FIG. 4e, vent holes 212 are formed in cover or lid 146, as shown in FIGS. 8a and 8b. Vent holes 212 allow a controlled bleed out of air and possibly a deminimus portion of TIM 150. The vast majority of TIM 150 remains in the controlled pocket 149 of heat sink 140 in fcBGA-H 210. Vents holes 212 can be applied in fcBGA-H 180 and in fcBGA-H 190.

Figure 9:
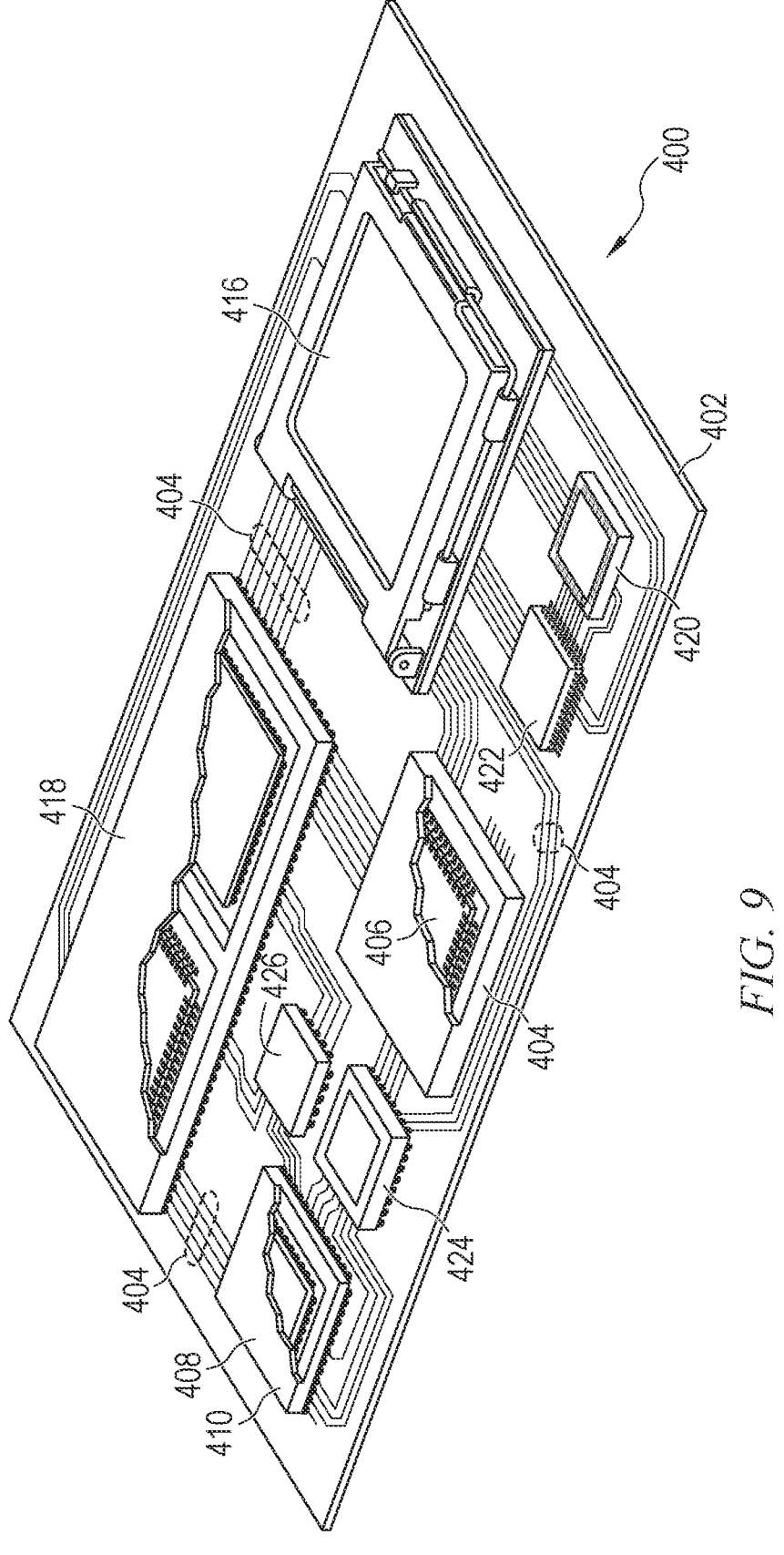
FIG. 9 illustrates a printed circuit board (PCB) with different types of packages disposed on a surface of the PCB.

FIG. 9 illustrates electrical device 400 having a chip carrier substrate or PCB 402 with a plurality of semiconductor packages disposed on a surface of PCB 402, including fcBGA-H 170, 190, 200, and 210. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a substrate;
an electrical component disposed over the substrate;
a dam material disposed on the substrate around the electrical component;

an underfill material filling a first gap between substrate and electrical component, wherein the underfill material extends to the dam material;
a heat sink disposed over the electrical component, wherein the heat sink includes a cover with a wall extending from the cover forming a pocket around a perimeter of the electrical component, wherein the pocket includes a lateral gap between the wall and the electrical component such that the electrical component does not directly physically contact the wall, and wherein the wall is a unibody extension of the cover; and
a thermal interface material (TIM) disposed between the cover and a surface of the electrical component, wherein the TIM remains contained within the pocket by physical contact with the wall, wherein the TIM is routed down a side surface of the electrical component physically contacting the side surface of the electrical component, and wherein the TIM extends only partially down the side surface of the electrical component without reaching a bottom surface of the electrical component or the substrate, and wherein a third gap remains between a top surface of the underfill material and a bottom surface of the TIM in the lateral gap.

2. The semiconductor device of claim 1, wherein the TIM includes liquid metal.

3. The semiconductor device of claim 1, wherein the heat sink includes:
a horizontal step; and
a riser extending from the horizontal step to the cover.

4. The semiconductor device of claim 1, wherein the wall includes a vent hole, and wherein the TIM extends to the vent hole.

5. The semiconductor device of claim 1, wherein the cover includes a vent hole.

6. The semiconductor device of claim 1, wherein the TIM physically contacts both a side surface of the electrical component and a surface of the wall, thereby spanning a gap between the wall and electrical component.

7. A semiconductor device, comprising:
a substrate, wherein the substrate includes a plurality of conductive layers and a plurality of insulating layers;
a dam material disposed on the substrate, wherein the dam material is formed of solder resist;
an electrical component disposed on the substrate within a boundary defined by the dam material, wherein the dam material extends continuously and completely around a perimeter of the electrical component in plan view, and wherein a solder bump of the electrical component extends to the substrate;
an underfill material extending around the solder bump and filling a first gap between substrate and electrical component, wherein the underfill material extends to the dam material on two opposing sides of the electrical component;
a heat sink disposed over the electrical component, wherein the heat sink includes,
a cover,
a wall extending from the cover forming a pocket around a perimeter of the electrical component, wherein the wall is positioned directly over the dam material, and
a first adhesive disposed between the cover and the wall, wherein the wall is bonded to the cover by the first adhesive;

a second adhesive disposed between the wall and the dam material, wherein the wall is bonded to the dam material by the second adhesive; and a thermal interface material (TIM) disposed between the electrical component and heat sink, wherein the TIM physically contacts both a side surface of the electrical component and a surface of the wall, thereby spanning a second gap between the wall and electrical component, and wherein a third gap remains between a top surface of the underfill material and a bottom surface of the TIM in the second gap.

8. The semiconductor device of claim 7, wherein the TIM remains contained within the pocket by the wall.

9. The semiconductor device of claim 7, wherein the TIM includes liquid metal.

10. The semiconductor device of claim 7, wherein the heat sink includes:

a horizontal step; and a riser extending from the horizontal step to the cover.

11. The semiconductor device of claim 7, wherein the wall includes a vent hole.

12. The semiconductor device of claim 7, wherein the cover includes a vent hole.

13. The semiconductor device of claim 7, wherein the wall is bonded to a surface of the cover.

14. A method of making a semiconductor device, comprising:

providing a semiconductor die;

disposing an underfill material under the semiconductor die;

disposing a thermal interface material (TIM) on a top surface of the semiconductor die, wherein the TIM is disposed to be contained completely on the top surface without extending outside a footprint of the semiconductor die; and disposing a heat sink over the semiconductor die after disposing the TIM on the top surface of the semiconductor die, wherein the heat sink includes a cover with a wall extending from the cover forming a pocket around a perimeter of the semiconductor die, wherein the pocket includes a lateral gap between the wall and the semiconductor die such that the semiconductor die does not directly physically contact the wall, wherein the wall is a unibody extension of the cover, wherein the heat sink presses the TIM such that the TIM is routed down and directly physically contacts a side surface of the semiconductor die but remains contained within the pocket by physical contact with the wall, and wherein a vertical gap remains between a top surface of the underfill material and a bottom surface of the TIM after disposing the heat sink.

15. The method of claim 14, wherein the TIM includes liquid metal.

16. The method of claim 14, further including providing the heat sink to include:

a horizontal step; and a riser extending from the horizontal step to the cover.

17. The method of claim 14, further including forming a vent hole in the wall.

18. The method of claim 14, further including forming a vent hole in the cover.

19. A method of making a semiconductor device, comprising:

providing a substrate, wherein the substrate includes a plurality of conductive layers and a plurality of insulating layers;

disposing a dam material on the substrate;

disposing an electrical component on the substrate within a boundary defined by the dam material, wherein the dam material extends continuously and completely around a perimeter of the electrical component in plan view;

disposing an underfill material between the substrate and electrical component;

disposing a thermal-interface material (TIM) over the electrical component, wherein the TIM extends down a side surface of the electrical component while a vertical gap remains between a top surface of the underfill material and a bottom surface of the TIM;

disposing a heat sink over the electrical component, wherein the heat sink includes a cover with a wall extending from the cover forming a pocket around a perimeter of the electrical component, and wherein the heat sink is positioned with the wall directly over the dam material; and disposing an adhesive between the wall and the dam material.

20. The method of claim 19, wherein the TIM remains contained within the pocket by the wall.

21. The method of claim 20, wherein the TIM includes liquid metal.

22. The method of claim 19, further including providing the heat sink to include:

a horizontal step; and a riser extending from the horizontal step to the cover.

23. The method of claim 19, further including forming a vent hole in the wall.

24. The method of claim 19, further including forming a vent hole in the cover.

* * * * *